United States Patent
Fujii

[11] Patent Number: 6,140,656
[45] Date of Patent: *Oct. 31, 2000

[54] ION IMPLANTATION APPARATUS, ION IMPLANTATION METHOD AND SEMICONDUCTOR DEVICE

[75] Inventor: Atsuhiro Fujii, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/554,015

[22] Filed: Nov. 6, 1995

[30] Foreign Application Priority Data

Jan. 10, 1995 [JP] Japan ..................... 7-002037

[51] Int. Cl.$^7$ .................. H01J 37/317; H01L 21/265
[52] U.S. Cl. ................... 250/492.21; 250/423 P
[58] Field of Search .............. 250/492.21, 423 P; 204/157.22

[56] References Cited

U.S. PATENT DOCUMENTS

| | | | |
|---|---|---|---|
| 3,443,087 | 5/1969 | Robieux et al. | 250/424 |
| 3,772,519 | 11/1973 | Levy et al. | 250/41.9 G |
| 3,914,655 | 10/1975 | Dreyfus et al. | 250/423 P |
| 4,158,139 | 6/1979 | Rostler | 250/423 P |
| 4,442,354 | 4/1984 | Hurst et al. | 250/281 |
| 4,670,064 | 6/1987 | Schachameyer et al. | 250/492.21 |
| 4,692,627 | 9/1987 | Ueda et al. | 250/423 P |

FOREIGN PATENT DOCUMENTS

| | | | |
|---|---|---|---|
| 58-157043 | 9/1983 | Japan . | |
| 60-208035 | 10/1985 | Japan . | |
| 2-32736 | 7/1990 | Japan . | |
| 2-288048 | 11/1990 | Japan . | |
| 3-95969 | 4/1991 | Japan . | |
| 3-165443A | 7/1991 | Japan . | |
| 4-242049 | 8/1992 | Japan | 250/423 P |
| 5-62420 | 9/1993 | Japan . | |

*Primary Examiner*—Jack Berman
*Attorney, Agent, or Firm*—McDermott, Will & Emery

[57] ABSTRACT

An ion generator vessel can be filled up with raw material gas containing a specific gas component. The ion generator vessel can be irradiated with a laser beam from a laser oscillator. Due to the beam which is applied into the ion generator vessel, only the specific gas component is selectively excited by multi-photon absorption, to generate ions. Thus, a semiconductor substrate can be inhibited from damage in ion implantation, and processability such as the throughput etc. can be improved.

4 Claims, 8 Drawing Sheets

ION IMPLANTATION APPARATUS, ION IMPLANTATION METHOD AND SEMICONDUCTOR DEVICE

BACKGROUND OF THE INVENTION

1. Field of the Invention

The present invention relates to an ion implantation apparatus and an ion implantation method, and more specifically, it relates to an ion implantation apparatus for ionizing gas and implanting the ions as formed into a wafer which is placed in the apparatus, and an ion implantation method.

The present invention also relates to a semiconductor device, and more specifically, it relates to a semiconductor device which is obtained by implanting ions into a wafer.

2. Description of the Background Art

A conventional ion implantation apparatus and a conventional ion implantation method are now described.

FIG. 8 is a typical diagram showing the structure of a conventional ion implantation apparatus. FIG. 9 is a flow chart showing steps of a conventional ion implantation method.

Referring to FIG. 8, the conventional ion implantation apparatus has an ion source, lead electrodes 209a and 209b, a mass spectrograph 211, an accelerator 213, and a vacuum chamber 215.

The ion source has an ion generator vessel 205 and a pair of electrodes 201a and 201b. The pair of electrodes 201a and 201b are arranged in the ion generator vessel 205 to be opposed to each other. A power source 201c applies a potential difference across the pair of electrodes 201a and 201b.

The ion generator vessel 205 is provided with a gas inlet path 205a for introducing reactive gas into the interior, and a gas outlet path 205b for discharging the reactive gas from the interior.

The lead electrodes 209a and 209b are adapted to draw ions which are generated in the ion generator vessel 205. A power source 209c applies a potential difference across the lead electrodes 209a and 209b. The mass spectrograph 211 is adapted to select target ions from those drawn by the lead electrodes 209a and 209b by changing the intensity of a magnetic field. The accelerator 213 is adapted to accelerate the ions for introducing the same into the vacuum chamber 215 at a prescribed speed. A wafer 20 is placed in the vacuum chamber 215, so that the ions are implanted into the same.

The ion implantation method which is carried out in the aforementioned ion implantation apparatus is now described.

Referring to FIGS. 8 and 9, gas or steam is first introduced into the ion generator vessel 205 through the gas inlet path 205a (step 231). The power source 201c applies a potential difference across the electrodes 201a and 201b (step 232). Thus, arch discharge is caused to ionize the gas (step 233).

The power source 209c applies a potential difference across the lead electrodes 209a and 209b, whereby the ions are drawn from the ion generator vessel 205 along arrow (step 234). The mass spectrograph 211 selects only target ions from the drawn ones (step 235). The accelerator 213 accelerates the target ions to the prescribed speed (step 236). Thus, the target ions are accelerated to the prescribed speed along a path R, and thereafter implanted into the wafer 20 which is placed in the vacuum chamber 215 (step 237).

Thus, the ions can be implanted into the wafer 20 by the conventional ion implantation apparatus and the conventional ion implantation method.

However, the conventional ion implantation apparatus and the conventional ion implantation method described above have the following problems (13) to (13), as hereafter described in detail.

(1) A p-type semiconductor substrate may be provided with a p-type retrograded well, in order to prevent a leakage current. This retrograded well is generally formed by ion-implanting boron (B) into the substrate. The boron B includes $^{10}B$ and $^{11}B$, which are isotopes having mass numbers of 10 and 11 respectively, as shown in the following Table:

|  | Abundance | Implantation Energy | Merit/Demerit |
|---|---|---|---|
|  |  | Implantation in the Same Depth |  |
| $^{11}B$ | 81% | 1 MeV | Throughput: About 3 min. per Wafer (Batch) |
| $^{10}B$ | 19% | Reduced by 9% to 910 keV | Damage and Metal Contamination Reduced by 9% Throughput: About 12 min. per Wafer (Batch) |

*Throughput: at the same gas flow rate

Here, the time of throughput depends on the amount of implantation, and, in the Table above, the throughput shown is of $^{10}B$ implantation when throughput of $^{11}B$ implantation is 3 minutes.

When $^{10}B$ which is lighter than $^{11}B$ is employed, the implantation energy can be reduced by about 9% as compared with a case of ion-implanting $^{11}B$ into a semiconductor substrate. In such ion implantation of $^{10}B$, therefore, it is possible to reduce damage by about 9% to the semiconductor substrate and metal contamination as compared with the ion implantation of $^{11}B$.

However, the natural abundance of $^{10}B$ is 19%, i.e., about ¼ of that of $^{11}B$ (81%). Thus, raw material gas of $BF_3$ which is employed in boron implantation generally contains $^{10}B$ and $^{11}B$ in the aforementioned natural abundance ratio. In ion implantation through the conventional ion implantation apparatus and the conventional ion implantation method employing the raw material gas of $BF_3$, therefore, the beam current value of $^{10}B$ is about ¼ of that of $^{11}B$, disadvantageously leading to reduction of the throughput. In other words, it is impossible for the conventional ion implantation apparatus and the conventional ion implantation method to improve the throughput while suppressing damage to the semiconductor substrate.

In general, further, there has been obtained no semiconductor device having a boron-implanted region such as a retrograded well, for example, which is inhibited from damage caused by ion implantation.

(2) In the conventional ion implantation apparatus and the conventional ion implantation method, the gas is ionized by arc discharge. In this case, all molecules and atoms forming the gas components are ionized. In other words, not only the target component but the remaining components are ionized. Therefore, excess energy is required for the ionization as compared with the case of ionizing only the target component, leading to remarkable energy loss.

(3) In the conventional ion implantation apparatus and the conventional ion implantation method, the electrodes $201a$ and $201b$ must be arranged in the ion generator vessel $205$, in order to ionize the gas by arc discharge. These electrodes $201a$ and $201b$ are generally made of carbon. Therefore, the carbon inevitably adheres to inner walls of the ion generator vessel $205$ etc. by sputtering in the arc discharge. Thus, it is necessary to remove the adhering carbon, with requirement for much labor for maintenance.

(4) In addition to the electrodes $201a$ and $201b$, the lead electrodes $209a$ and $209b$ for drawing the ions are also arranged in the ion generator vessel $205$. Thus, the ion generator vessel $205$ is provided therein with a number of electrodes, which restrain each other. Thus, it is difficult to set conditions for and arrangement of the electrodes.

(5) In the conventional ion implantation apparatus and the conventional ion implantation method, all molecules and atoms of the gas are ionized by the arc discharge. Thus, a plurality of species of ions may be drawn by the lead electrodes $209a$ and $209b$. The mass spectrograph $211$ is adapted to select only the target ions in this case. In other words, the mass spectrograph $211$ implants only the target ions into the wafer $20$ along the path R, while the remaining ions are made to collide with inner walls $S_1$ and $S_2$ of the apparatus along paths $R_1$, and $R_2$. Sputtering is caused by such collision of the ions with the inner walls $S_1$ and $S_2$, resulting in contamination etc. Due to such contamination, a bad influence such as leakage is exerted on a device which is formed on the semiconductor substrate.

(6) As hereinabove described, the conventional ion implantation apparatus and the conventional ion implantation method inevitably require the mass spectrograph $211$ for selecting the ions since a plurality of species of ions may be drawn by the lead electrodes $209a$ and $209b$. Thus, the apparatus is complicated in structure and increased in size due to such provision of the mass spectrograph $211$.

SUMMARY OF THE INVENTION

An object of the present invention is to suppress damage to a semiconductor substrate upon ion implantation and to improve processability such as the throughput.

Another object of the present invention is to reduce energy loss in ionization.

Still another object of the present invention is to save labor for maintenance of an apparatus.

A further object of the present invention is to simplify setting of conditions and arrangement in an ion generator vessel.

A further object of the present invention is to obtain a device having excellent characteristics while suppressing contamination.

A further object of the present invention is to minimize an ion implantation apparatus.

An ion implantation apparatus according to the present invention is adapted to ionize gas and implant the ions as formed into a wafer which is placed in the apparatus, and comprises an ion generator vessel and light generation means. The ion generator vessel can be filled up with raw material gas containing a specific gas component. The light generation means is so arranged as to generate light having a wavelength which is substantially identical to an absorption wavelength of the specific gas component, for applying the light into the ion generator vessel. Due to the light which is applied into the ion generator vessel, only the specific gas component is selectively excited by photon absorption to generate ions.

An ion implantation method according to the present invention is adapted to ionize gas for implanting the ions as formed into a wafer which is placed in an apparatus, and comprises the following steps:

First, an ion generator vessel is filled up with raw material gas containing a specific gas component. Then, light generation means generates light having a wavelength which is identical to an absorption wavelength of the specific gas component. This light is applied into the ion generator vessel, so that only the specific gas component is excited by photon absorption, to generate ions. Then, the ions are implanted into the wafer.

According to the ion implantation apparatus and the ion implantation method according to the present invention, as hereinabove described, only the specific gas component can be ionized by light excitation through photon absorption. Therefore, also when the gas contains $^{10}B$ and $^{11}B$ in a mixed state, for example, only $^{10}B$ can be selectively ionized. According to the light excitation, it is possible to obtain an electron beam having extremely high energy as compared with arc discharge. Thus, damage to the wafer can be reduced by implanting $^{10}B$, while the throughput can be improved due to the strong electron beam.

Since only the specific gas component can be ionized, no energy is required for ionizing unnecessary atoms and molecules. Thus, energy loss is reduced and energy efficiency is improved.

Further, it is not necessary to arrange electrodes in the ion generator vessel, dissimilarly to the case of arc discharge. Thus, no carbon etc. adheres to the ion generator vessel, whereby labor for maintenance can be saved.

Since the ion generator vessel may be provided with no electrodes for arc discharge, it is not necessary to consider mutual restraint between such electrodes for arc discharge and a lead electrode for drawing the ions. Thus, it is possible to readily set conditions for and arrangement of the lead electrode etc.

An ion implantation apparatus according to a first preferred aspect of the present invention further comprises reflection means. The reflection means are mounted on opposite surfaces of inner walls of the ion generator vessel. The reflection means and the light generation means are so arranged that the light which is applied into the ion generator vessel is multiple-reflected by the reflection means.

In an ion implantation method according to the first preferred aspect of the present invention, reflection means are mounted on opposite surfaces of inner walls of the ion generator vessel. The step of generating ions includes a step of multiple-reflecting the light which is applied into the ion generator vessel by the reflection means.

In the ion implantation apparatus and the ion implantation method according to the aforementioned first preferred aspect of the present invention, the reflection means are so provided in the ion generator vessel as to multiplex-reflect the light. Namely, the light is reciprocated between the opposite inner walls of the ion generator vessel by the reflection means a plurality of times. Thus, it is possible to ensure a light path length (the so-called absorption light path length) which is necessary to cause photon absorption. The absorption light path length can be ensured without increasing the ion generator vessel in size, whereby the specific gas component can be efficiently ionized.

An ion implantation apparatus according to a second preferred aspect of the present invention further comprises a lead electrode for drawing ions from the ion generator vessel.

The ion implantation apparatus according to the second preferred aspect of the present invention can ionize only the specific gas component by photon absorption, whereby it is not necessary to select the ions which are drawn from the ion generator vessel. Thus, no mass spectrograph is required for selecting target ions. Further, it is also possible to adjust the speed for drawing the ions by the lead electrode. Therefore, no accelerator is required for accelerating the ions to a prescribed speed. Thus, the apparatus can be simplified in structure and reduced in size.

Since no mass spectrograph is required, unnecessary ions are inhibited from colliding with the inner walls of the apparatus. Thus, no sputtering is caused by collision of the ions with the inner walls of the apparatus, to result in no dust. Thus, a device having an excellent leakage property etc. can be obtained.

In an ion implantation apparatus according to a third preferred aspect of the present invention, the light generation means applies light which results from formation of the specific gas component into the ion generator vessel.

In an ion implantation method according to the third preferred aspect of the present invention, light which is generated by the light generation means results from formation of the specific gas component.

In the ion implantation apparatus and the ion implantation method according to the third preferred aspect of the present invention, the light resulting from formation of the specific gas component is applied to the specific gas component. The wavelength of the light resulting from formation of the specific gas component is identical to that of light which is absorbed in dissociation of the same specific gas component. Thus, it is possible to efficiently ionize the specific gas component by applying the light resulting from formation thereof.

A semiconductor device according to the present invention is obtained by implanting ions into a wafer, and comprises a semiconductor substrate, and an impurity region consisting of $^{10}B$ which is formed in the semiconductor substrate.

According to the present invention, a semiconductor device having small damage can be obtained due to implantation of $^{10}B$.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(1) Ion Implantation Apparatus

Figure 1:
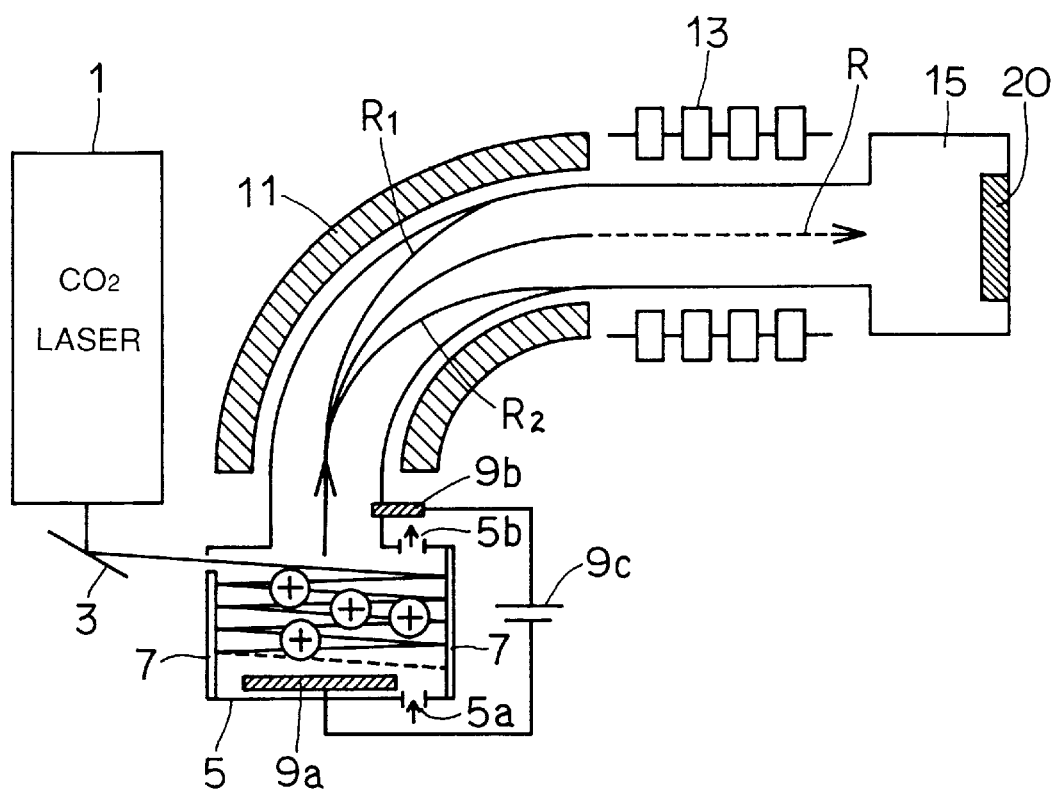
FIG. 1 is a typical diagram showing the structure of an ion implantation according to an embodiment of the present invention.

Referring to FIG. 1, an ion implantation apparatus according to an embodiment of the present invention has an ion source, lead electrodes 9a and 9b, a mass spectrograph 11, an accelerator 13, and a vacuum chamber 15.

The ion source has a laser oscillator 1, an optical system 3 consisting of an optical mirror or a diffraction grating, and a multiple reflection system 7 consisting of paired mirrors. The laser oscillator 1 is adapted to oscillate a $CO_2$ laser beam, for example. The optical system 3 is adapted to apply the laser beam into the ion generator vessel 5. The ion generator vessel 5 can be filled up with gas. This gas is introduced from a gas inlet port 5a which is provided in the ion generator vessel 5, and discharged from a gas outlet port 5b. The multiple reflection system 7 is formed by the paired mirrors, which are mounted on opposite wall surfaces of the ion generator vessel 5. The laser beam is applied into the ion generator vessel 5 through a window part which is provided therein.

The lead electrodes 9a and 9b are adapted to draw generated ions from the ion generator vessel 5. The mass spectrograph 11 is adapted to select target ions from the drawn ones. The accelerator 13 is adapted to accelerate the selected ions for introducing the same into the vacuum chamber 15 at a prescribed speed. A wafer 20 is placed in the vacuum chamber 15, so that the ions are implanted into the same.

(2) Ion Implantation Method

Description is now made on an ion implantation method according to the embodiment of the present invention, employing the ion implantation apparatus shown in FIG. 1.

Figure 2:
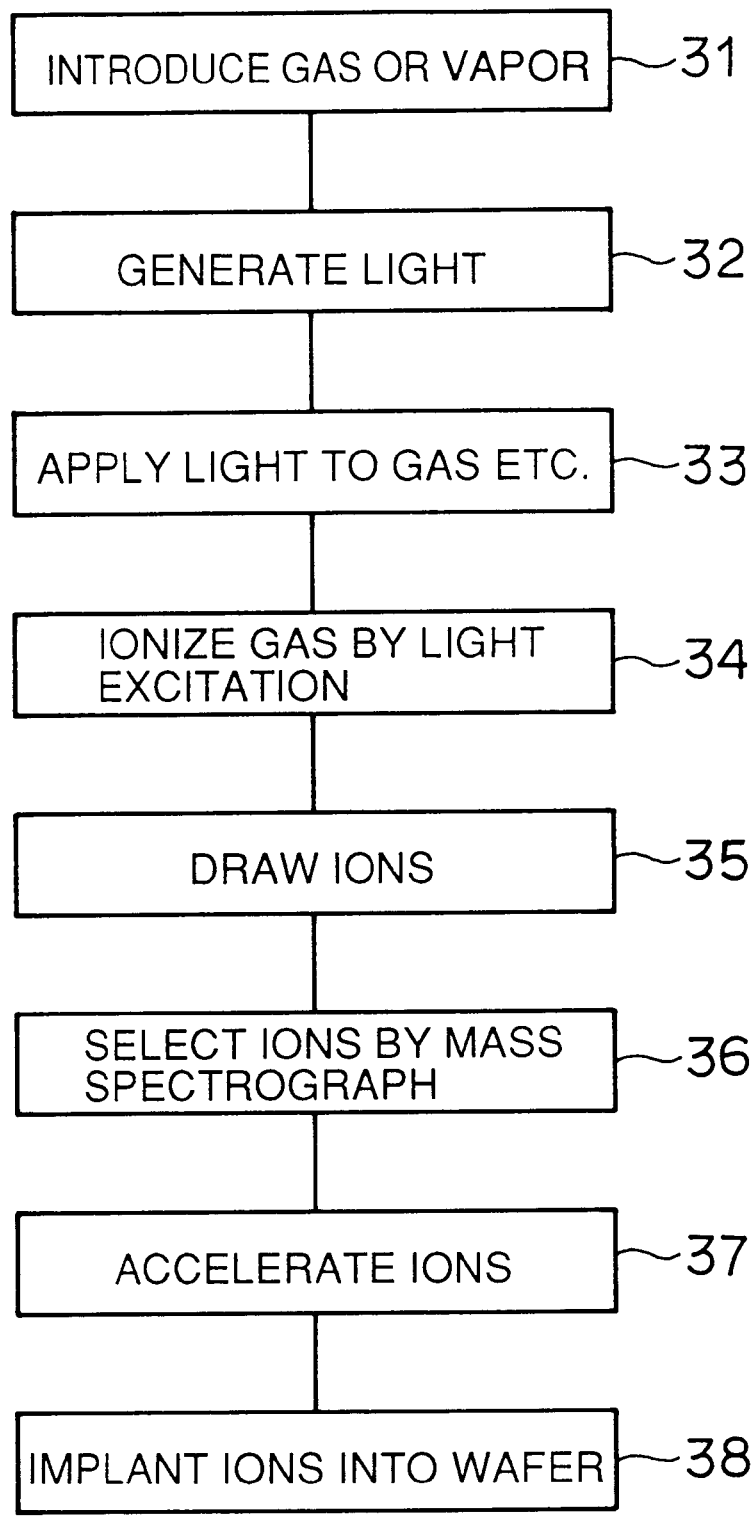
FIG. 2 is a flow chart showing steps of an ion implantation method according to the embodiment of the present invention.

Referring to FIGS. 1 and 2, the ion generator vessel 5 is first brought into a state at a degree of vacuum of not more than $10^{-5}$ Torr, for example. Thereafter, gas or vapor, e.g. $BF_3$ gas, is introduced from the gas inlet port 5a into the ion generator vessel 5 at a high speed (step 31). The $BF_3$ gas is introduced at a high speed, so that the same is cooled and the absorption band is regularized. The laser oscillator 1 emits a $CO_2$ laser beam, for example (step 32). This laser beam is applied into the ion generator vessel 5 through the window (not shown) by the optical system 3 (step 33).

This laser beam is multiple-reflected between the pair of mirrors 7 in the ion generator vessel 5. In other words, the laser beam is reciprocated between the pair of mirrors 7 a plurality of times. Due to such multiple reflection, the laser beam is photon-absorbed (resonance-absorbed) by the $BF_3$ gas in the ion generator vessel 5, thereby ionizing $BF_3$ which is contained in the $BF_3$ gas (step 34). Thus, $^{10}B$ ions are obtained. Further, ions of $^{10}BF$, $^{10}BF_2$, $^{10}BF_3$ and F, for example, are also obtained in addition to the ions of $^{10}B$.

Thereafter a power source 9c applies a prescribed potential difference across the lead electrodes 9a and 9b. The lead potential is about 30 keV, for example. Thus, the ions are drawn from the ion generator vessel 5 (step 35). The drawn ions are selected by the mass spectrograph 11 (step 36). In other words, only the ions of $^{10}B$ reach the wafer 20 along a path R. The remaining ions are made to collide with the inner walls of the apparatus along paths $R_1$ and $R_2$. According to this embodiment, the ions of $^{10}BF$, $^{10}BF_2$, $^{10}BF_3$ and F, which are heavier than the target ions of $^{10}B$, collide with the inner walls of the apparatus along the paths $R_1$.

Then, the ions of $^{10}B$ travelling along the path R are accelerated by the accelerator 13 to a prescribed speed (step 37). Then, the ions of $^{10}B$ accelerated to the prescribed speed are implanted into the wafer 20 which is placed in the vacuum chamber 15 (step 38).

According to the ion implantation method of this embodiment, the ions are thus implanted into the wafer 20.

Description is now made on infra-red multi photon decomposition (IRMPD), which is the principle of ion generation in this embodiment.

Figure 3:
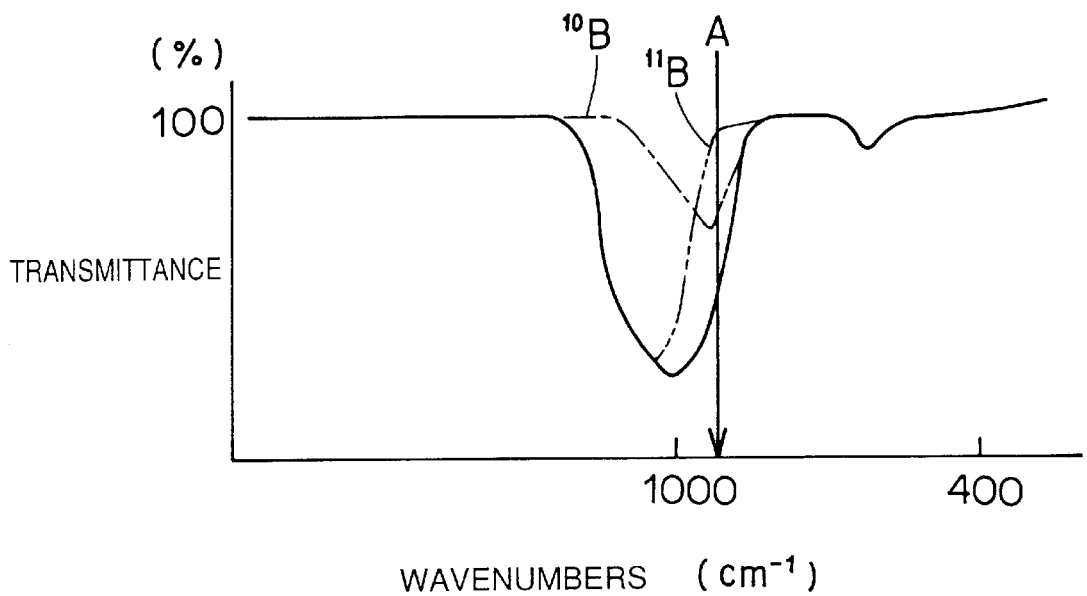
FIG. 3 is a graph showing infrared absorption spectra of $BF_3$ gas.

Referring to FIG. 3, the axis of ordinates show transmittance, and the axis of abscissas shows wavenumbers. The solid line shows the infrared absorption spectrum of naturally occurring $BF_3$ gas, while the one-dot and two-dot chain lines show infrared absorption spectra of simple bodies of $^{10}BF_3$ and $^{11}BF_3$ respectively.

A molecule consisting of atoms having different sizes necessarily has a light absorption band with respect to a certain specific wavelength. It is known that naturally occurring $BF_3$ gas has an absorption band with a large molecular absorption coefficient in an infrared region in the vicinity of about 10 $\mu m$ (=1000 $cm^{-1}$). On the other hand, $^{10}BF_3$ has an absorption band of a lower wavelength than $^{11}BF_3$.

When light having a wavelength shown by arrow A is applied, $^{10}BF_3$ absorbs this light while $^{11}BF_3$ hardly absorbs the same. This is because $^{11}BF_3$ has high transmittance and is transparent with respect to the light (coherent light) having the wavelength of arrow A. On the other hand, $^{10}BF_3$ absorbs the light due to its low transmittance, and is selectively excited. Thus, it is possible to selectively excite and ionize only one element among isotopes.

Only one element can be selectively excited among isotopes since oscillation wavelengths (9.4 $\mu m$ and 10.2 $\mu m$) for the $CO_2$ laser beam overlap with the absorption wavelength (1000 $cm^{-1}$) of stretching vibration of the $BF_3$ gas.

When only one photon is absorbed, atoms are merely vibration-excited since the aforementioned absorption is that of light having a wavelength in the infrared region. When up to 1000 photons are selectively momentarily absorbed in $^{10}BF_3$ in several $\mu sec$., however, only $^{10}B$ is ionized at a stretch.

In case of violet light, it is possible to ionize a specific gas component with one photon by light excitation.

Figure 4:
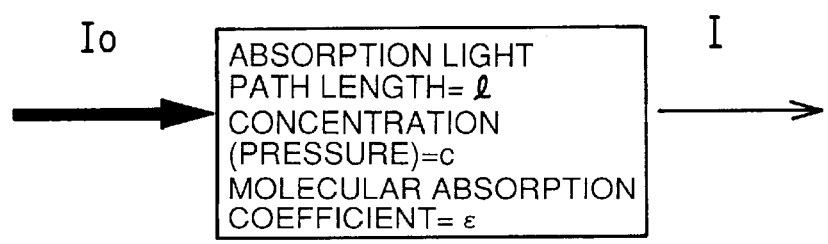
FIG. 4 is a typical diagram showing the Lambert-Beer's law.

The amount of light absorption is determined by the Lambert-Beer's rule shown in FIG. 4. Referring to FIG. 4, the ratio $I/I_0$ between intensity $I_0$ of incident light and intensity I of transmitted light is expressed as follows:

$$I/I_0 = \exp^{\epsilon c l}$$

where l, c and $\epsilon$ represent the absorption light path length, the concentration (pressure) and the molecular absorption coefficient respectively. The energy value of an electron beam which is obtained on the basis of such a principle of infrared multi-photon decomposition is obtained as follows:

First, the energy of one photon at a wavelength of 10 $\mu m$ is $2 \times 10^{-21}$ J. The dissociation energy of boron (B) is about $1.33 \times 10^{-18}$ J, and hence it is necessary to absorb about 667 photons, in order to ionize boron. A 1 kW $CO_2$ laser emits energy of about $5 \times 10^{23}$ photons/sec. Assuming that 0.1% of the overall energy of this laser is absorbed, therefore, an electron beam having energy corresponding to 800 mA (1A=$6.3 \times 10^{18}$ electrons/sec.).

The energy of an electron beam which is obtained by conventional arc discharge is about 50 mA. Thus, it is understood possible to obtain a sufficient electron beam output by a 1 kW $CO_2$ laser beam.

Due to such high energy of the electron beam, a large amount of ions can be generated so that the time for implanting the ions into the wafer can be reduced.

According to the ion implantation apparatus and the ion implantation method of this embodiment, as hereinabove described, only the specific gas component ($^{10}BF_3$) can be ionized by light excitation through photon absorption. Also when the gas contains $^{10}B$ and $^{11}B$ in a mixed state, therefore, only $^{10}B$ can be selectively ionized. According to this light excitation, further, it is possible to obtain an electron beam having extremely high energy as compared with arc discharge. Thus, only $^{10}B$ having smaller mass than $^{11}B$ can be implanted at strong electron beam energy, whereby damage to the wafer can be reduced and the throughput can be improved.

Since only the specific gas component ($^{10}BF_3$) can be selectively ionized, no energy is required for ionizing unnecessary molecules or atoms such as those of $^{11}BF_3$, for example. Thus, energy loss is reduced and energy efficiency is improved.

Figure 8:
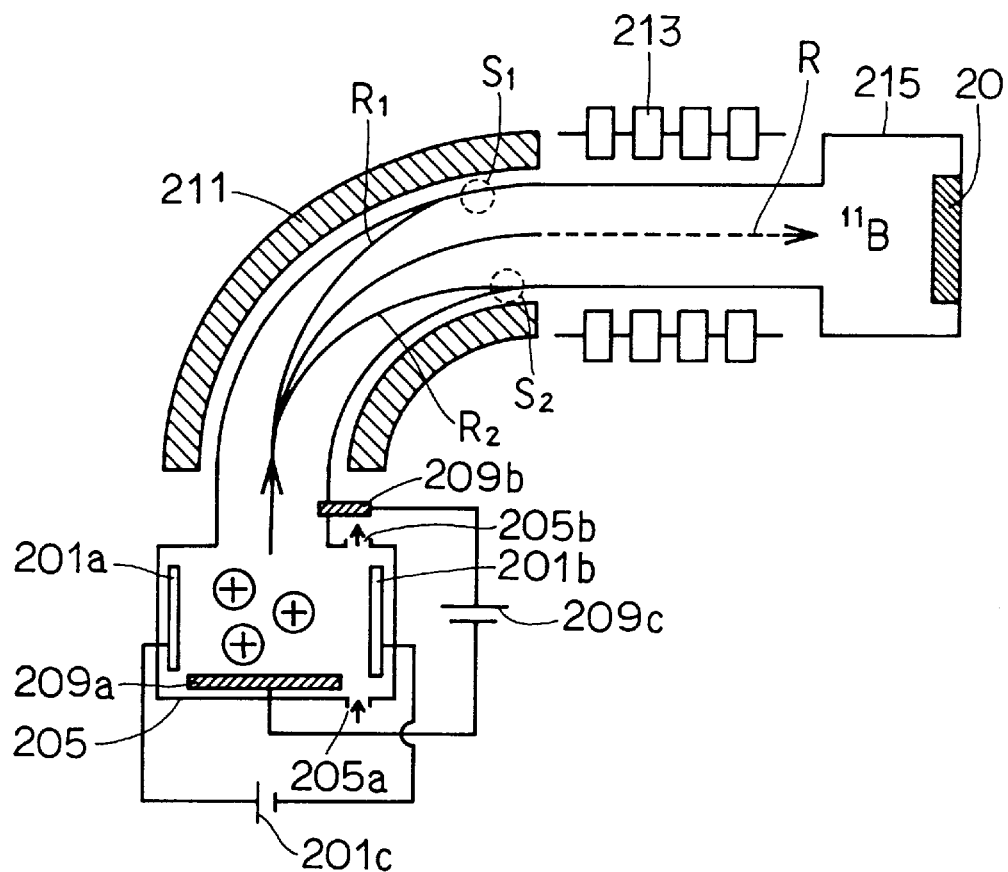
FIG. 8 is a typical diagram showing the structure of a conventional ion implantation apparatus.
Figure 9:
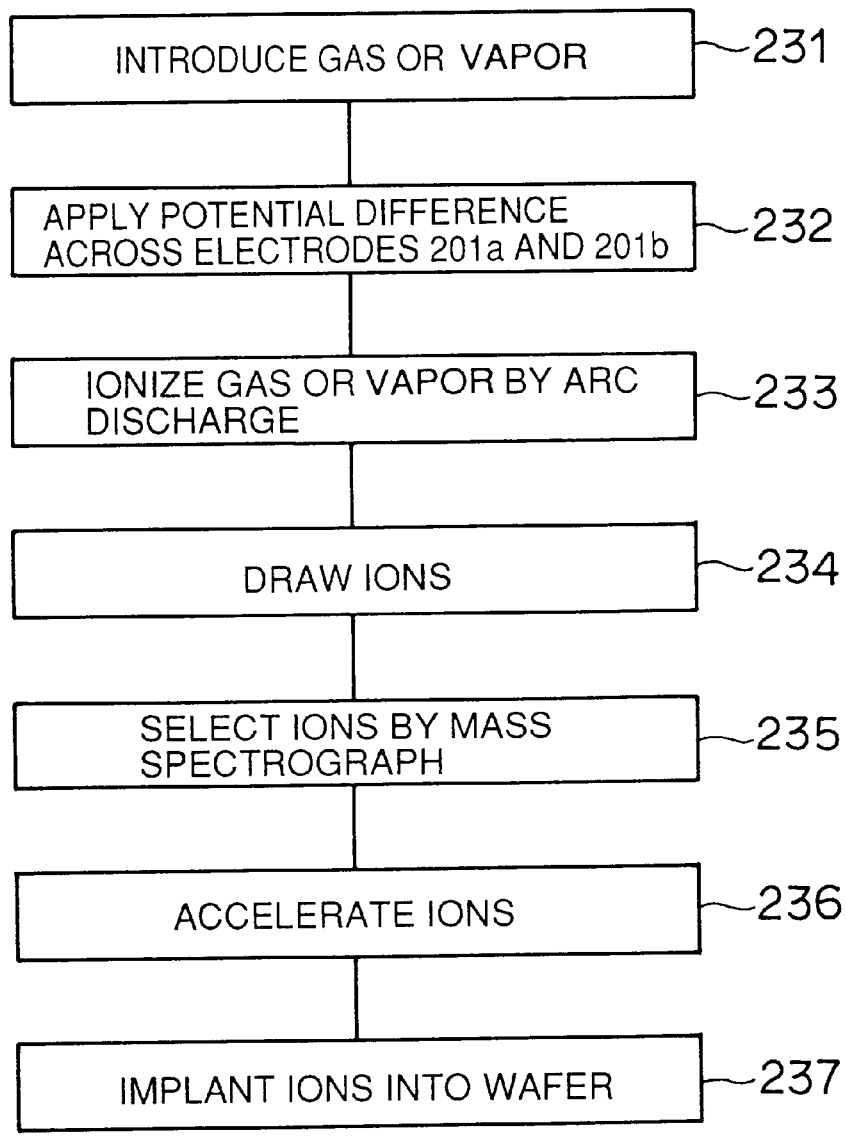
FIG. 9 is a flow chart showing steps of a conventional ion implantation method.

According to this embodiment, no arc discharge is employed dissimilarly to the prior art shown in FIG. 8, whereby it is not necessary to arrange electrodes 201a and 201b in the ion generator vessel 205. In this embodiment, therefore, no carbon is derived from electrodes in the ion generator vessel 5 shown in FIG. 1 by sputtering in arc discharge. Thus, no carbon adheres to the ion generator vessel 5. Therefore, the labor for maintenance can be saved since it is not necessary to remove adhering carbon.

According to this embodiment, further, the ion generator vessel 5 may not be provided with electrodes for arc discharge as hereinabove described, whereby it is not necessary to consider mutual restraint between such electrodes for arc discharge and the lead electrodes 9a and 9b for drawing the ions. Thus, it is possible to readily set ion drawing conditions and arrangement of the lead electrodes 9a and 9b.

As shown in FIG. 1, the reflection means 7 forming a multiplex reflection system are provided on the opposite inner walls of the ion generator vessel 5. Namely, the light is reciprocated by the reflection means 7 between the opposite inner walls of the ion generator vessel 5 a plurality of times. Thus, it is possible to ensure a light path length (the so-called absorption light path length: see FIG. 4) which is necessary for causing photon absorption. Thus, the absorption light path length can be ensured without increasing the ion generator vessel 5 in size, whereby the specific gas component such as $^{10}BF_3$ can be efficiently ionized.

In addition, only the specific gas component such as $^{10}BF_3$ can be ionized by photon absorption. Thus, other gas components such as $^{11}BF_3$ are not ionized but remain in the ion generator vessel 5. Thus, the unionized gas components are not made by the mass spectrograph 11 to collide with the inner walls of the apparatus. Therefore, no sputtering is caused by ions of $^{11}BF_3$ colliding with the inner walls of the apparatus, and hence no dust results from such sputtering. Thus, a device having an excellent leakage property etc. can be obtained.

(3) Semiconductor Device Obtained by the Above Described Ion Implantation

Figure 5:
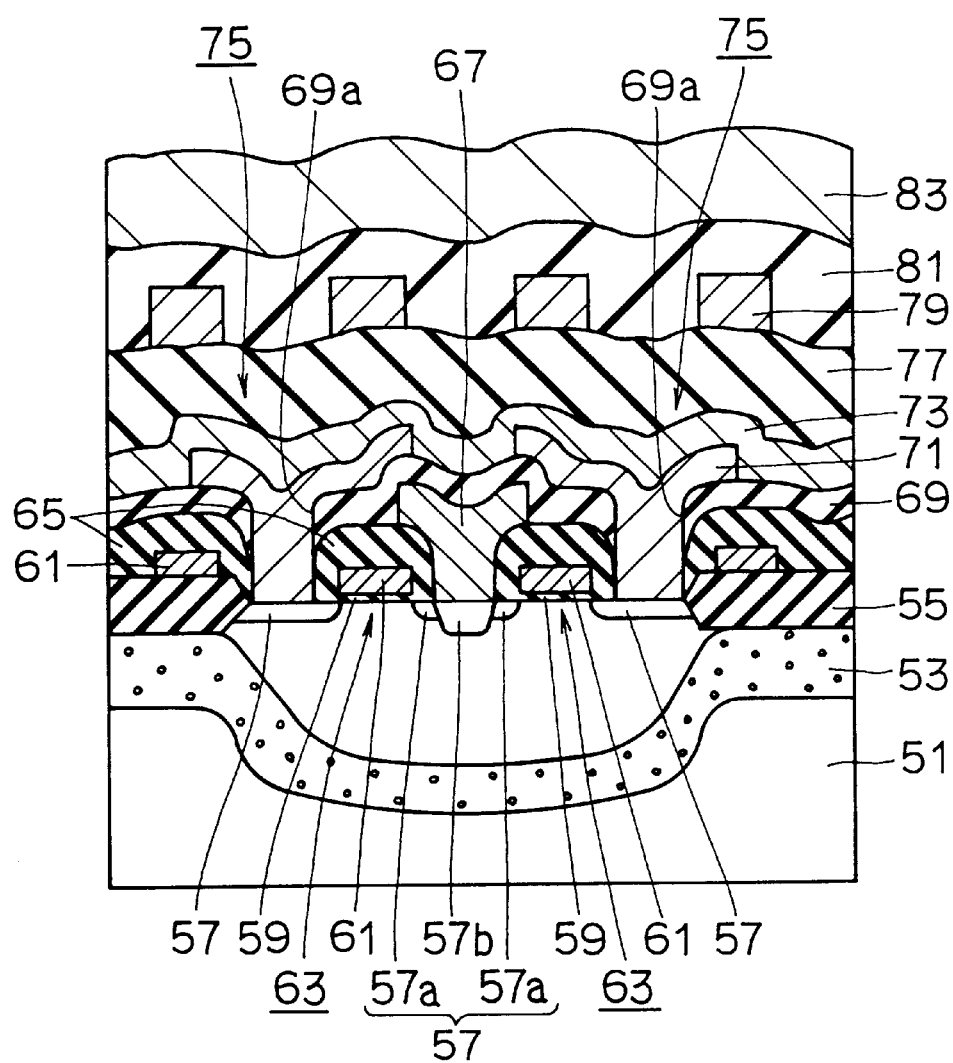
FIG. 5 is a sectional view schematically showing an exemplary semiconductor device which is fabricated by the inventive ion implantation.

Referring to FIG. 5, an element isolation insulating layer 55 is formed on a surface of a p-type silicon substrate 51 in a prescribed shape, to isolate an active region. Further, a retrograded well 53 is formed to be in contact with a lower region of the element isolation insulating layer 55 and to cover a lower side of the active region. This retrograded well 53 is an impurity region which is formed by implantation of $^{10}B$.

A memory cell of a DRAM (dynamic random access memory), for example, is formed in the active region.

The memory cell has an nMOS (metal oxide semiconductor) transistor 63 and a capacitor 75.

The nMOS transistor 63 has a pair of source/drain regions 57, a gate insulating layer 59, and a gate electrode layer 61. The pair of source/drain regions 57 are formed on the surface of the p-type silicon substrate 51 at a prescribed distance from each other. The gate electrode layer 61 is formed on a region held between the pair of source/drain regions 57 through the gate insulating layer 59.

One of the pair of source/drain regions 57 has an LDD (lightly doped drain) structure. Namely, this source/drain region 57 is in a two-layer structure of impurity regions 57a and 57b having relatively low and high concentrations respectively.

An insulating layer 65 is formed to cover side surfaces and an upper surface of the gate electrode layer 61. Further, a bit line 67 is formed to be in contact with the source/drain region 57 having the LDD structure and to reach an upper surface of the insulating layer 65. An insulating layer 69 is formed on the overall surface of the p-type silicon substrate 51, to cover the bit line 67. The insulating layer 69 is provided with a contact hole 69a reaching the other source/drain region 57. The capacitor 75 is formed to be in contact with the other source/drain region 57 through the contact hole 69 a.

The capacitor 75 has a storage node (lower electrode) 71, a capacitor dielectric film (not shown), and a cell plate (upper electrode) 73. The storage node 71 is formed to be electrically connected with the other source/drain region 57 through the contact hole 69a and to extend on an upper surface of the insulating layer 69. The cell plate 73 is formed on the storage node 71 through the capacitor dielectric film.

An interlayer insulating layer 77 is formed to cover the capacitor 75. First aluminum wiring layers 79 extending in prescribed shapes are formed on a surface of the interlayer insulating layer 77. Another interlayer insulating layer 81 is formed to cover the first aluminum wiring layer 79. A second aluminum wiring layer 83 is formed on a surface of the interlayer insulating layer 81.

Thus, the retrograded well 53 consisting of $^{10}B$ is formed by the aforementioned ion implantation apparatus and the ion implantation method. In the ion implantation of $^{10}B$, damage to the p-type silicon substrate 51 can be reduced as compared with that of $^{11}B$. Thus, a device which is less damaged can be obtained.

$^{10}B$ and $^{11}B$, which are absolutely identical in chemical and physical properties to each other, behave identically to each other as p-type impurities, as a matter of course.

While the laser oscillator 1 shown in FIG. 1 is formed by a $CO_2$ laser having a wavelength which is close to that of an absorption band of $^{10}BF_3$, the same may alternatively be formed by a chemical laser.

(4) Employment of Chemical Laser

Figure 6:
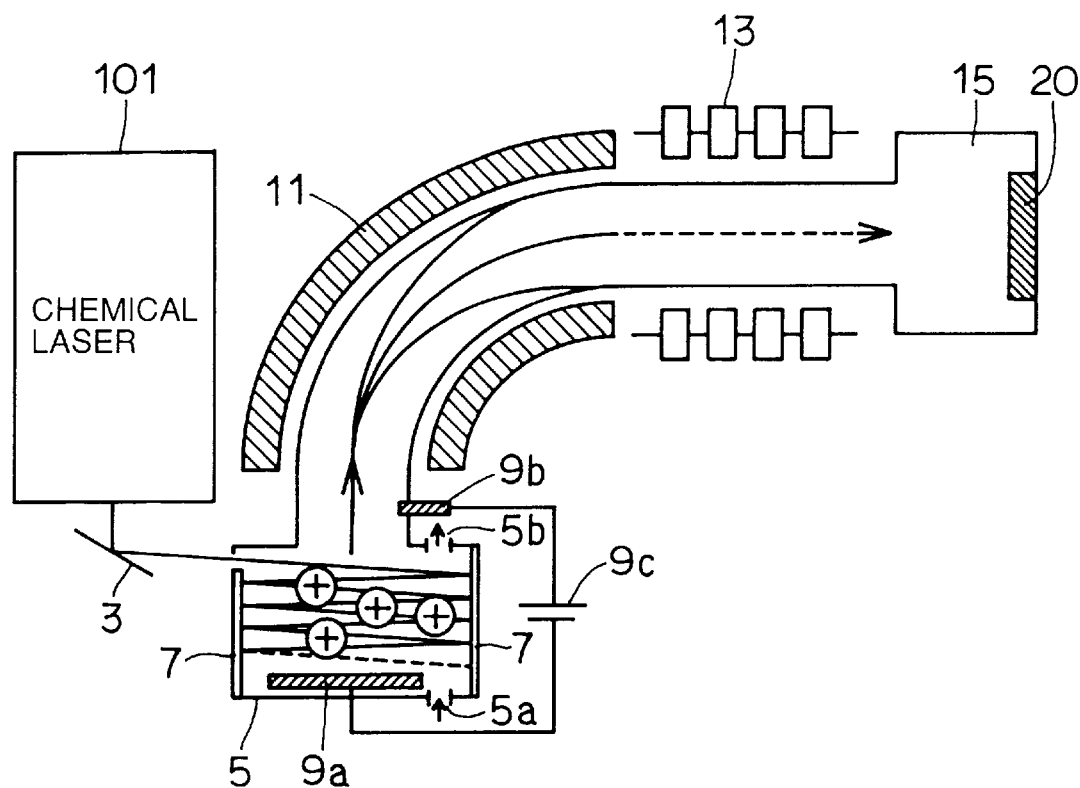
FIG. 6 is a typical diagram showing the structure of an ion implantation apparatus employing a chemical laser for a laser oscillator.

An embodiment shown in FIG. 6 is different in structure from that shown in FIG. 1 in a point that a laser oscillator 101 is formed by a chemical laser. This chemical laser 101 is adapted to extract reaction light which results from formation of $^{10}BF_3$ gas from $^{10}B$ gas and $F_2$ gas, for example. The wavelength of the reaction light resulting from formation of $^{10}BF_3$ is the same as the wavelength of the reaction light absorbed upon dissociating $^{10}BF_3$. When this reaction light is applied, therefore, $^{10}BF_3$ is further efficiently dissociated and ionized in an ion generator vessel 5.

This embodiment is substantially identical in structure to that shown in FIG. 1 except the laser oscillator 101, and hence members identical to those shown in FIG. 1 are denoted by the same reference numerals, to omit redundant description.

The laser oscillator 101 is not restricted to the aforementioned chemical laser, but light may be applied from any light source so far as the same has a wavelength which is substantially identical to the absorption wavelength of $^{10}B$. Further, the specific gas component is not restricted to $^{10}B$, and the laser oscillator 101 can be formed by any light source so far as the same can apply light having a wavelength which is substantially identical to the absorption wavelength of the specific gas component to be ionized by light excitation.

While the apparatus shown in FIG. 1 is provided with the mass spectrograph 11 and the accelerator 13, these members may be omitted on the basis of the principle of infrared multi-photon decomposition. Such a structure is now described.

(5) Omission of Mass Spectrograph and Accelerator

Figure 7:
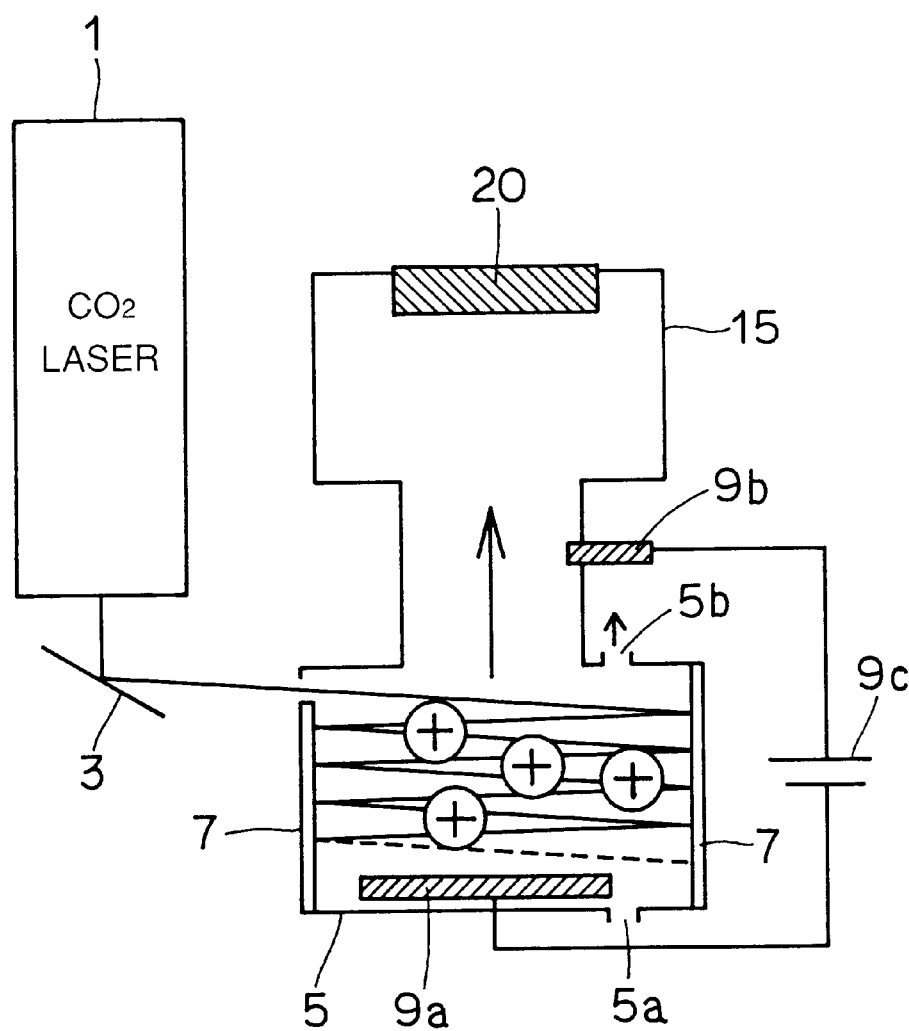
FIG. 7 is a typical diagram showing the structure of an ion implantation apparatus from which a mass spectrograph and an accelerator are removed.

FIG. 7 is a typical diagram showing the structure of an embodiment from which a mass spectrograph and an accelerator are removed.

Referring to FIG. 7, an ion implantation apparatus according to this embodiment is provided with neither mass spectrograph nor accelerator. Therefore, an ion generator vessel 5 is directly connected to a vacuum chamber 15 in which a wafer 20 is placed.

This embodiment is substantially identical in other structure to that shown in FIG. 1, and hence members identical to those shown in FIG. 1 are denoted by the same reference numerals, to omit redundant description.

Only a specific gas component such as $^{10}BF_3$ can be ionized by photon excitation through photon absorption, whereby it is not necessary to select the ions which are drawn from the ion generator vessel 5. Thus, no mass spectrograph is required for selecting the target ions. Further, it is also possible to adjust the speed for drawing the ions by lead electrodes 9a and 9b, whereby no accelerator is required for accelerating the ions to a prescribed speed. Also when the apparatus is provided with neither mass spectrograph nor accelerator, therefore, it is possible to implant specific ions into the wafer 20 at the prescribed speed.

In ionization of $^{10}BF_3$, ions of $^{10}BF$, $^{10}BF_2$, $^{10}BF_3$ and F are also formed in addition to those of $^{10}B$. Thus, these ions may also be implanted into the wafer 20. However, no problem is caused by implantation of these ions since F (fluorine) atoms are easily out-diffused by heat treatment of a later step which is applied to the wafer 20.

According to this embodiment, the apparatus can be simplified in structure and reduced in size due to omission of the mass spectrograph and the accelerator.

While $^{10}BF_3$ is excited among components of the $BF_3$ gas in the above description, it is also possible to alternatively excite and ionize $^{11}BF_3$. In this case, the laser oscillator 1 or 101 may be formed by a light source for generating light having a wavelength which is close to the absorption band of $^{11}BF_3$.

When $^{10}BF_3$ contained in $BF_3$ gas is ionized and implanted into the wafer 20, $^{11}BF_3$ gas remains in the ion generator vessel 5. It is possible to obtain $^{11}BF_3$ enriched gas containing a large amount of $^{11}BF_3$ by recovering and purifying the remaining reaction secondary gas ($^{11}BF_3$).

It is possible to selectively implant $BF_3$, $PF_3$, $AsF_3$, $AsF_5$ or $SbF_3$ by varying the wavelength of the light which is emitted from the laser oscillator 1 or 101, as a matter of course.

While the retrograded well 53 is described with reference to FIG. 5 as an impurity region which is formed by ion implantation, it is also possible to form another impurity region. When a shallow junction such as a source/drain region is formed, $^{11}BF_2$ ions are employed. In this case, it is possible to form ions of $^{11}BF_2$ and implant the same at low energy by matching the wavelength of the applied light with the absorption band of $^{11}B$ and weakening the output of the applied light.

The gas inlet port 5a is preferably so arranged that multiplex-reflected beams are overlappingly applied to a gas flow which is introduced from this port 5a.

In the ion implantation apparatus and the ion implantation method according to the present invention, only a specific gas component can be selectively ionized by light excitation through multi-photon absorption. According to this light excitation, it is possible to obtain an electron beam having extremely high energy as compared with arc discharge. Thus, damage to a wafer can be reduced in ion implantation, and the throughput can be improved.

Since only the specific gas component can be ionized, no energy is required for ionizing unnecessary atoms and molecules. Thus, energy loss is reduced and energy efficiency is improved.

Further, it is not necessary to arrange electrodes in an ion generator vessel, dissimilarly to the case of arc discharge. Thus, no carbon adheres to the interior of the ion generator vessel, whereby it is possible to save labor for maintenance required for removal of carbon etc.

In addition, it is not necessary to consider mutual restraint between electrodes for arc discharge and lead electrodes for drawing ions, since the ion generator vessel may not be provided with arc discharge electrodes. Thus, it is possible to readily set conditions for and arrangement of the lead electrodes etc.

In the ion implantation apparatus and the ion implantation method according to the first preferred aspect of the present invention, the reflection means are provided to multiple-reflect the light in the ion generator vessel. Thus, it is possible to ensure a light path length which is necessary for causing multi-photon absorption. Therefore, the absorption light path length can be ensured without increasing the ion generator vessel in size, whereby the specific gas component can be efficiently ionized.

In the ion implantation apparatus according to the second preferred aspect of the present invention, only the specific gas component can be ionized by multi-photon absorption, whereby it is not necessary to select the ions which are drawn from the ion generator vessel. Thus, no mass spectrograph is required for selecting the target ions. Further, it is also possible to adjust the speed for drawing the ions by the lead electrodes. Thus, no accelerator is required for accelerating the ions to the prescribed speed. Thus, the apparatus can be simplified in structure and reduced in size.

In the ion implantation apparatus according to the third preferred aspect of the present invention, only the specific gas component can be ionized by multi-photon absorption, whereby it is not necessary to select the ions by a mass spectrograph. Thus, no unnecessary ions are made to collide with the inner walls of the apparatus by the mass spectrograph. Therefore, no sputtering is caused by collision of the ions with the inner walls of the apparatus, to result in no dust. Thus, a device having an excellent leakage property etc. can be obtained.

In the ion implantation apparatus according to the third preferred aspect of the present invention, the light resulting from formation of the specific gas component is applied to the specific gas component. The wavelength of the light resulting from formation of the specific gas component is identical to that of light absorbed in dissociation of the specific gas component. When the light resulting from formation of the specific gas component is applied to the specific gas component, therefore, the component can be further effectively ionized.

According to the present invention, it is possible to obtain a less damaged semiconductor device due to implantation of $^{10}B$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An ion implantation apparatus for ionizing gas and implanting ions as formed into a wafer being placed in said apparatus, said ion implantation apparatus comprising:

an ion generator vessel capable of being filled up with raw material gas containing specific gas; and light generation means being so arranged as to generate light having a single wavelength being substantially identical to an absorption wavelength of said specific gas for applying said light into said ion generator vessel, only specific gas consisting of chemical material with a necessary mass number being selectively excited and ionized by causing one atom or one molecule of said specific gas to absorb only one photon using light being applied into said ion generator vessel.

2. The apparatus according to claim 1, wherein:

the raw material gas is $BF_3$; and the ions to be implanted into the wafer are $^{10}B$ ions.

3. An ion implantation method of ionizing gas and implanting ions as formed into a wafer being placed in an apparatus, said method comprising the steps of:

filling an ion generator vessel with raw material gas containing specific gas;

generating light having a single wavelength being substantially identical to an absorption wavelength of said specific gas by light generation means;

applying said light into said ion generator vessel and causing one atom or one molecule of said specific gas to absorb only one photon for selectively exciting and ionizing only specific gas consisting of chemical material with a necessary mass number; and implanting said ions into said wafer.

4. The method according to claim 3, wherein:

the raw material gas is $BF_3$; and the ions to be implanted into the wafer are $^{10}B$ ions.

* * * * *